(12) United States Patent
Bürg

(10) Patent No.: US 11,947,883 B1
(45) Date of Patent: Apr. 2, 2024

(54) SYSTEMS, METHODS, AND MEDIA FOR GENERATING A SIGNED DISTANCE FIELD TO A SURFACE OF A POINT CLOUD FOR A MATERIAL POINT METHOD UTILIZED FOR GEOTECHNICAL ENGINEERING

(71) Applicant: Bentley Systems, Incorporated, Exton, PA (US)

(72) Inventor: Markus Bürg, Deflt (NL)

(73) Assignee: Bentley Systems, Incorporated, Exton, PA (US)

(*) Notice: Subject to any disclaimer, the term of this patent is extended or adjusted under 35 U.S.C. 154(b) by 491 days.

(21) Appl. No.: 17/103,181

(22) Filed: Nov. 24, 2020

(51) Int. Cl.
| | | |
|---|---|---|
| G06F 30/23 | (2020.01) | |
| G06F 30/13 | (2020.01) | |
| G06T 7/73 | (2017.01) | |
| G06T 17/20 | (2006.01) | |
| G06T 19/20 | (2011.01) | |

(52) U.S. Cl.
CPC .............. *G06F 30/23* (2020.01); *G06F 30/13* (2020.01); *G06T 7/75* (2017.01); *G06T 17/205* (2013.01); *G06T 19/20* (2013.01); *G06T 2207/20224* (2013.01)

(58) Field of Classification Search
CPC . G06F 30/23; G06F 30/13; G06T 7/75; G06T 17/205; G06T 19/20; G06T 2207/20224
See application file for complete search history.

(56) References Cited

PUBLICATIONS

Beuth et al. "Formulation and validation of a quasi-static Material Point Method" 2007 (Year: 2007).*
Stomakhin et al. "A material point method for snow simulation" ACM Transactions on Graphics, vol. 32, No. 4, Article 102, Publication Date: Jul. 2013 (Year: 2013).*
Pantev, "Contact modelling in the Material Point Method", MSC Thesis, TU Delft, 2016, 108 pages (Year: 2016).*
Y. Hu et al., "A Moving Least Squares Material Point Method with Displacement Discontinuity and Two-Way Rigid Body Coupling", ACM TOG 37.4, No. 150, 2018, 14 pages (Year: 2018).*
I. Pantev: *Contact modelling in the Material Point Method, MSc Thesis, TU Delft*, 2016, 108 pages.
Y. Hu et al.: *A Moving Least Squares Material Point Method with Displacement Discontinuity and Two-Way Rigid Body Coupling, ACM TOG 37.4*, No. 150, 2018, 14 pages.

* cited by examiner

*Primary Examiner* — Rehana Perveen
*Assistant Examiner* — Troy A Maust
(74) *Attorney, Agent, or Firm* — Cesari and McKenna, LLP

(57) ABSTRACT

In an embodiment, a process may divide elements of a mesh into sub-elements utilizing field nodes. The process may determine if each field node is inside or outside a material point cloud. The process may calculate a distance from each outside field node to a surface of the material point cloud based on a surface vector in a normal direction and a deformed volume of a material point. The process may calculate a distance from each inside field node to the surface of the material point cloud based on a surface vector, in a normal direction and associated with an outside field node closest to the inside field node, that takes into account a deformed volume of a material point. The process may utilize the distances to generate a signed distance field that may be used to perform calculations to simulate a behavior of a physical material/object that exhibit deformations.

17 Claims, 10 Drawing Sheets

SYSTEMS, METHODS, AND MEDIA FOR GENERATING A SIGNED DISTANCE FIELD TO A SURFACE OF A POINT CLOUD FOR A MATERIAL POINT METHOD UTILIZED FOR GEOTECHNICAL ENGINEERING

BACKGROUND

Technical Field

The present disclosure relates generally to geotechnical engineering, and more specifically to systems, methods, and media for generating a signed distance field to a surface of a material point cloud for a material point method utilized for geotechnical engineering.

Background Information

Geotechnical engineering is the application of scientific methods and engineering principles to the acquisition, interpretation, and use of knowledge of materials of the Earth's crust and earth materials for the solution of engineering problems and the design of engineering works. Geotechnical engineering may be used to predict a behavior of the Earth, its various materials and processes towards making the Earth more suitable for human activities and development. Geotechnical engineering may utilize the fields of soil mechanics and rock mechanics, and may have applications in the fields of geology, geophysics, hydrology, and other related sciences. Examples of the application of geotechnical engineering may include, but are not limited to, prediction, prevention or mitigation of damage caused by natural hazards such as avalanches, mud flows, landslides, rockslides, sinkholes, and volcanic eruptions; the application of soil, rock and groundwater mechanics to the design and predicted performance of earthen structures such as dams; the design and performance prediction of foundations of bridges, buildings, and other man-made structures in terms of the underlying soil and/or rock; and flood control and prediction.

The Material Point Method (MPM) is a technique that may be utilized in geotechnical engineering and, specifically, in geotechnical modeling and numerical analysis. For example, the MPM may be utilized to analyze large deformation behaviors of soils, structures and fluids, and their interactions, such as internal and external erosion, and post-liquefaction analysis; for instance the post-failure liquid-like behaviors of landslides, penetration problems such as the cone penetration test (CPT) and pile installation, and scouring problems related to underwater pipelines.

The MPM is considered a "meshless" spatial discretization strategy because a continuum is not mapped with a rigid mesh, but is instead divided into material points, for a discretized physical material/object, that move along an arbitrary background mesh that may comprise a plurality of elements and that may not hold state variables. As such, the MPM may be well suited for dealing with problems that involve large deformations of the physical material/object e.g., soils, structures and fluids, and their interactions.

The material points that represent the physical material/object may collectively be referred to as a point cloud or a material point cloud. The material points associated with the MPM (sometimes called particles) carry information (e.g., mass, volume, stress, state variables, etc.) and are cast over the background mesh including the elements having a shape and size defined by nodes and edges. The information is mapped to the nodes of the background mesh utilizing, for example, shape functions. Calculations, e.g., integration calculations, assembly of a stiffness matrix and right-hand side vector, may be carried out utilizing a solver, e.g., matrix solver, during simulation in a modeling/simulation environment to simulate a behavior of the physical material/object that may exhibit deformations and/or to simulate a behavior of an interaction of a plurality of materials/objects that may exhibit deformations. For example, the volumes of material points may deform, i.e., change, during simulations of the physical material/object when, for example, a model of the physical material/object deforms in the modeling/simulation environment over one or more time steps.

The accuracy of the results of the calculations and/or stability to perform the calculations during simulation may depend on how accurately the domain that is occupied by the material point cloud, i.e., the surface of the material point cloud, is defined. For example, if the surface of the material point cloud is inaccurately or imprecisely defined, then the distances calculated from the surface of the material point cloud to arbitrary points in space may also be inaccurate or imprecise. Utilizing such inaccurate or imprecise distances may cause inaccurate results of the calculations during simulation and/or may cause instability such that the calculations cannot be performed during simulation.

SUMMARY

In one or more embodiments, the disclosed systems, methods, and media include generating a signed distance field to a surface of a material point cloud for a material point method (MPM). Specifically, a process, e.g., an application executing on a device, may divide one or more elements of a background mesh into sub-elements utilizing field nodes, and then generate the signed distance field to the surface of the material point cloud based on vectors calculated from the field nodes to the surface of the material point cloud and volumes, e.g., deformed volumes, of the material points. The process may utilize the signed distance field, where the signed distance field has positive and negative values respectively outside and inside the material point cloud, to perform calculations during time steps of a simulation.

More specifically, the process may determine a number of subdivisions for each element of a background mesh, where an element may be divided into sub-elements based on the number of subdivisions and utilizing field nodes. The process may determine if each field node, of a plurality of field nodes, is an inside field node that is inside the material point cloud or an outside field node that is outside of the material point cloud.

The process may calculate a distance, e.g., a positive distance value, from each outside field node to the surface of the material point cloud. More specifically, the process may calculate a normal vector from a given outside field node to the surface of a material point cloud. To calculate the normal vector, the process may select, for the given outside field node, one or more nearest non-empty sub-elements. The identified non-empty sub-elements can be used to select one or more material points that are used to calculate the normal vector from the given outside field node to the surface of the material point cloud as described in further detail below.

The process may project a connecting vector, connecting the given outside field node to its closest material point, onto the normal vector to produce a surface vector in the normal direction from the given outside field node to the surface of the material point cloud. The process may reduce a length of the surface vector based on a volume, e.g., deformed volume, associated with the closest material point to the given outside field node. The length of the surface vector, that is reduced based on the volume of the material point, may be a distance, e.g., positive distance value, from the given outside field node to the surface of the material point cloud. The process may calculate the distance from each other outside field node in a similar manner to calculate other positive distance values to the surface of the material point cloud.

The process may also calculate a distance, e.g., a negative distance value, from each inside field node to the surface of the material point cloud. More specifically, the process may determine, for a given inside field node, a closest outside field node. The process may calculate a connecting vector connecting the given inside field node to its closest outside field node. The process may project the connecting vector onto a normal vector from the closest outside field node to the surface of the material point cloud. The process may determine the length of the projecting vector, and subtract a length of a surface vector for the closest outside field node (i.e., the surface vector in the normal direction from the closest outside field node to the surface of the material point cloud that has a length that is reduced by a volume, e.g., deformed volume, of a closest material point) from the projected vector to calculate a distance from the given inside field node to the surface of the material point cloud. The process may multiply the result of the subtraction by −1 to determine a negative distance value from the given inside field node to the surface of the material point cloud. The process may calculate the distance from each other inside field node in a similar manner to calculate other negative distance values to the surface of the material point cloud.

As a model of the physical material/object deforms in the modeling/simulation environment, the volumes of the material points may deform, i.e., change, over one or more time steps. As such, the one or more embodiments described herein may take into account, for the calculated distances from the outside and inside field nodes to the surface of the material point cloud, the different deforming volumes of the material points at different time steps during the simulation to generate the signed distance field where points in space that are outside the material point cloud have positive signed distance values and the points in space that are inside the point cloud have negative signed distance values.

For example, the signed distance field can be generated for one or more time steps that takes into account the volumes of the material points during the one or more time steps, and the signed distance field can be generated for one or more different time steps that takes into account the volumes of the material points during one or more different time steps. Thus, the signed distance field, generated according to the one or more embodiments described herein, can change over simulation time steps based on the volumes of the material points that may change over the simulation time steps. The process may utilize the signed distance field, generated according to the one or more embodiments described herein, to, for example, assemble a stiffness matrix and a right-hand side vector to simulate a behavior of the physical material/object that may exhibit deformations and/ or to simulate a behavior of an interaction of a plurality of materials/objects that may exhibit deformations.

Because the signed distance field is generated based on the calculated vectors and volumes of material points that may change over time steps of the simulation, the one or more embodiments described herein may generate a more accurate signed distance field than other systems and techniques that do not, for example, take into account the volumes of the material points.

As such, the signed distance field generated according to the one or more embodiments described herein can be used to perform the calculations during time steps of a simulation, which in turn improves the accuracy of the results of the calculations and/or stability to perform the calculations during simulation. Because the accuracy of results and stability during simulation are improved, the size of the time steps may be increased during simulation, which in turn results in a reduced number of calculations having to be performed during the simulation (i.e., less number of calculations have to be performed when compared to techniques that use a signed distance field that does not take into account volumes of material points). Because less calculations have to be performed, the one or more embodiments described herein conserve processing resources of a computer, e.g., device, that executes the simulation and performs the calculations. As such, the one or more embodiments described herein provide an improvement to a computer, e.g., a device that executes the simulation and performs the calculations, itself.

BRIEF DESCRIPTION OF THE DRAWINGS

The description below refers to the accompanying drawings, of which.

DETAILED DESCRIPTION OF AN ILLUSTRATIVE EMBODIMENT

Figure 1:
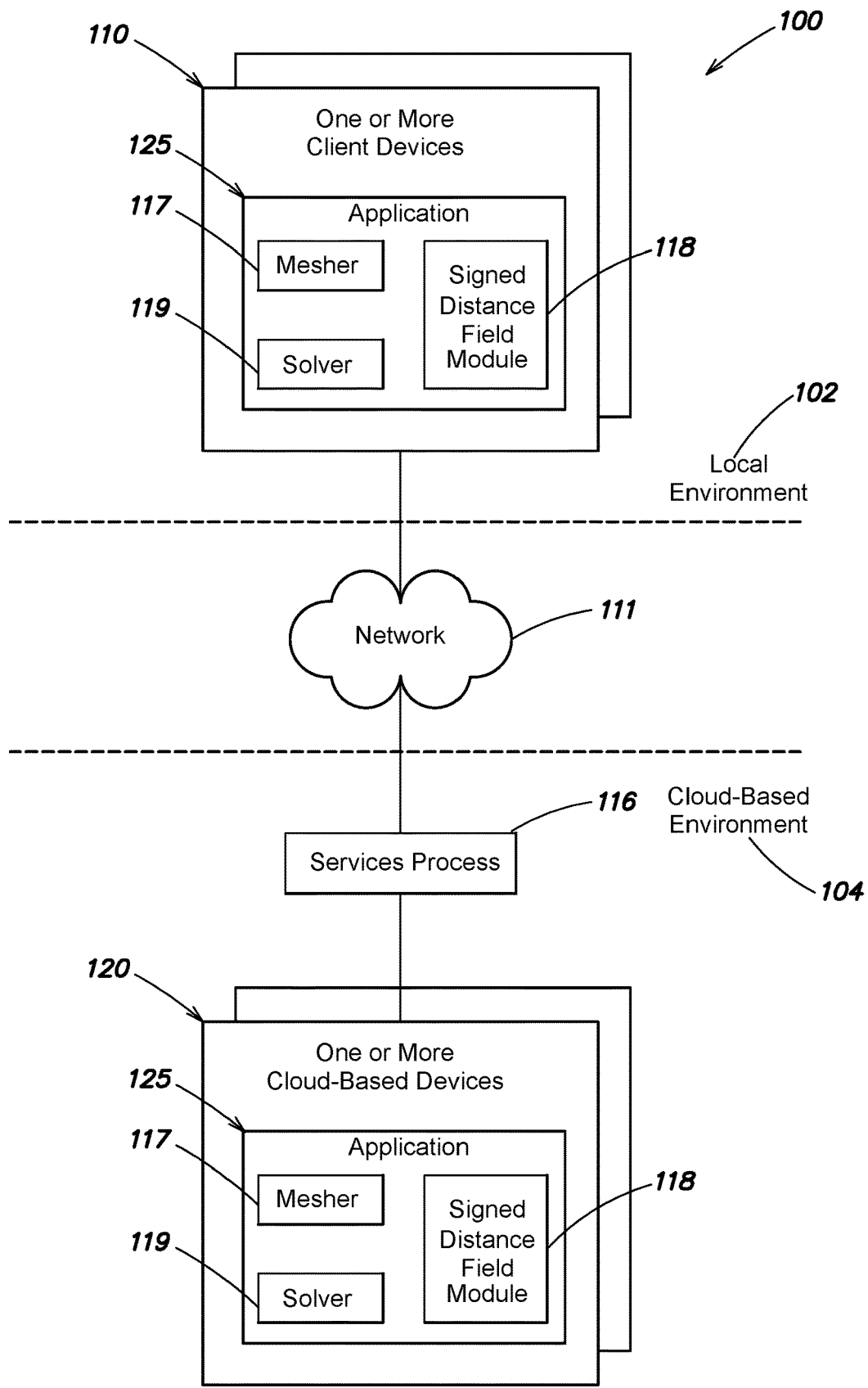
FIG. 1 is a high-level block diagram of an example architecture for generating a signed distance field to a surface of a material point cloud for a material point method utilized for geotechnical engineering according to one or more embodiments described herein.

FIG. 1 is a high-level block diagram of an example architecture 100 for generating a signed distance field to a surface of a material point cloud for a material point method utilized for geotechnical engineering according to one or more embodiments described herein. The architecture 100 may be divided into a local environment 102 that includes one or more local client devices 110 that are local to an end-user, and a cloud-based environment 104 that includes one or more cloud-based client devices 120 that are remote from the end-user and that are accessible to the end-user via a network 111 (e.g., the Internet). Each computing device, e.g., one or more local client devices 110 and one or more cloud-based client devices 120, may include processors, memory/storage, a display screen, and other hardware (not shown) for executing software, storing data and/or displaying information. A local client device 110 may provide a variety of user interfaces and non-processing intensive functions. For example, a local client device 110 may provide a user interface, e.g., a graphical user interface and/or a command line interface, for receiving user input and displaying output according to the one or more embodiments described herein. A services process 116 may coordinate operation of the one or more local client devices 110 and the one or more cloud-based client devices 120 such that, for example, the one or more local client devices 110 may communicate with and access the one or more cloud-based client devices 120 via network 111.

The one or more client devices 110 and/or one or more cloud-based client devices 120 may store and execute application 125 that may generate a signed distance field for a material point cloud for a material point method (MPM) according to one or more embodiments described herein. In an embodiment, the application 125 may be geotechnical engineering software that includes a modeling/simulation environment that may simulate a behavior of a physical material/object that exhibits deformations. In an embodiment, application 125 is the PLAXIS software available from Bentley Systems, Inc.

In an implementation, the one or more local client devices 110 may download and store application 125 that generates a signed distance field for a material point cloud according to the one or more embodiments described herein. In an implementation, the one or more local client devices 110 may utilize one or more user interfaces to access, via services process 116, the application 125 that is stored on the one or more cloud-based client devices 120 and that generates a signed distance field for a material point cloud according to the one or more embodiments described herein.

The application 125 may include a mesher 117, a signed distance field module 118, and a solver 119. The mesher 117 may create a background mesh based on information (e.g., a geometrical description, model parameters/conditions for a model that includes the material points 310 and represents the physical material/object in the modeling/simulation environment) that may be provided by an end-user utilizing a user interface of the local client device 110.

The signed distance field module 118 may generate a signed distance field to a surface of a material point cloud based on calculated vectors and volumes, e.g., deformed volumes, of the material points according to the one or more embodiments described herein and as described in further detail below. The solver 119 may utilize information (e.g., mass, volume, stress, state variables, etc.) of the material points and the information provided via the one or more user interfaces with the background mesh to perform one or more calculations to simulate a behavior of the physical material/object that may exhibit deformations and/or to simulate a heavier of an interaction of a plurality of materials/objects that may exhibit deformations. For example, the solver 119 may utilize the signed distance field, generated according to the one or more embodiments described herein, to assemble a stiffness matrix and a right-hand side vector to simulate a behavior of the physical material/object that may exhibit deformations and/or to simulate a behavior of an interaction of a plurality of materials/objects that may exhibit deformations. In an implementation, results (e.g., tables, graphics, etc.) of the calculations performed during simulation may be displayed via the user interfaces of the local client device 110 such that the end-user may interact with the results utilizing, for example, the user interfaces.

Although FIG. 1 depicts the mesher 117, signed distance field module 118, and solver 119 being separate entities of application 125, it is expressly contemplated that the functionalities of mesher 117, signed distance field module 118, and solver 119 may be performed by a single entity/process according to the one or more embodiments described herein.

Figure 2:
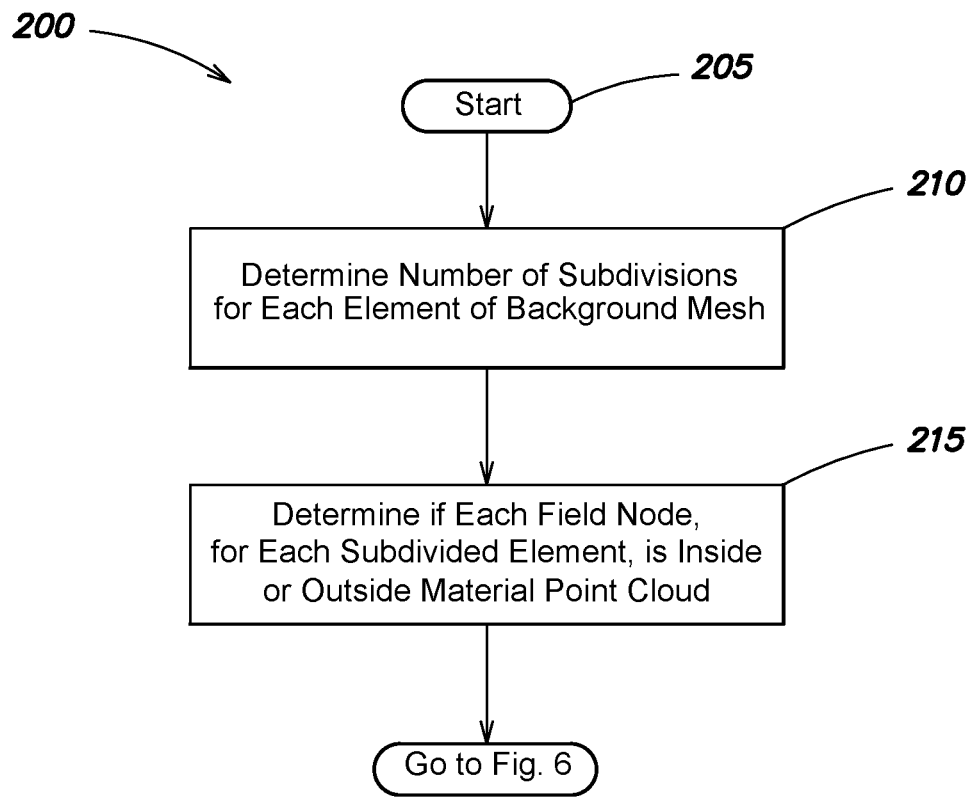
FIG. 2 is a flow diagram of a sequence of steps for dividing elements of a background mesh into sub-elements using field nodes according to the one or more embodiments described herein.

FIG. 2 is a flow diagram of a sequence of steps for dividing elements of a background mesh into sub-elements using field nodes according to the one or more embodiments described herein. After dividing the elements of the background mesh into sub-elements as described with reference to the procedure of FIG. 2, a signed distance field can be generated to the surface of the material point cloud based on vectors calculated from the field nodes to the surface of the material point cloud and volumes of the material points as described in further detail below with reference to the FIGS. 6-10.

Figure 3:
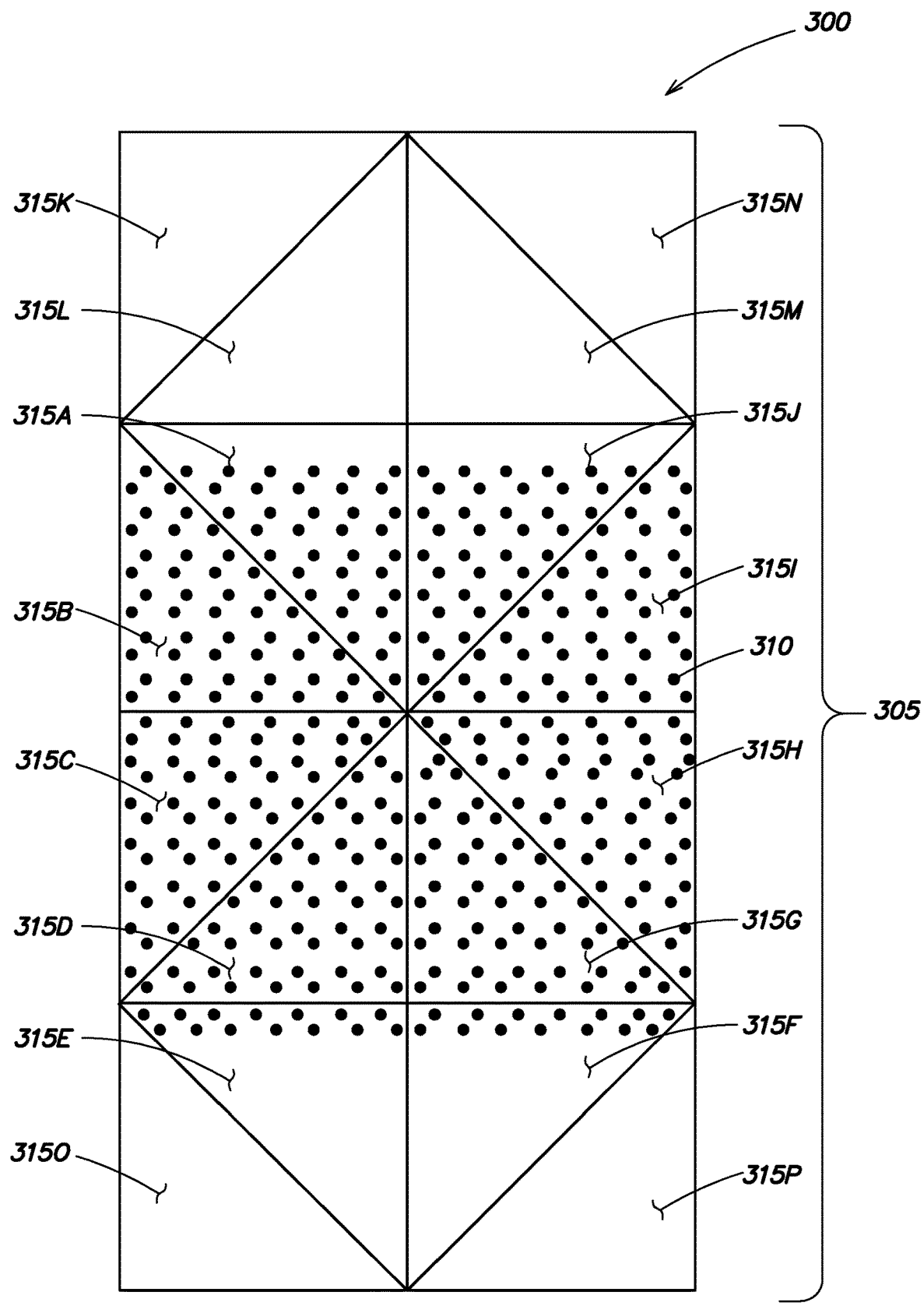
FIG. 3 is a diagram illustrating example input data in a modeling/simulation environment, where the input data includes a background mesh with material points that may be contained within one or more elements according to one or more embodiments described herein.

The procedure 200 starts at step 205 and continues to step 210 where the signed distance field module 118 determines a number of subdivisions for each element of a background mesh. FIG. 3 is a diagram illustrating example input data 300 in a modeling/simulation environment, where the input data 300 includes a background mesh 305 with material points 310 that may be contained within one or more elements 315A-P according to one or more embodiments described herein. The material points 310 collectively may be referred to as a point cloud or a material point cloud that may be stored at the client device 110 and/or cloud-based device 120. In an embodiment, a physical material/object that exhibits deformations and/or a plurality of interacting physical materials/objects that may exhibit deformations is/are discretized by the material points 310.

In the example of FIG. 3, a cube is the physical object that may exhibit deformations and that is discretized by the material points 310 in the modeling/simulation environment. For simplicity and ease of understanding, reference number 310 in FIG. 3 refers to a single material point, but it is expressly contemplated that each material point in FIG. 3 may be associated with reference number 310. As depicted in FIG. 3, elements 315A-J include material points 310, while elements 315K-P are empty.

In an embodiment, mesher 117 may create background mesh 305 based on information (e.g., a geometrical description, model parameters/conditions for a model that includes the material points 310 and represents the physical material/object in the modeling/simulation environment) that may be provided by an end-user utilizing a user interface of the local client device 110.

Although elements 315A-P are triangles in FIG. 3, it is expressly contemplated that the elements as described herein may be different geometric shapes, e.g., squares, rectangles, etc., that may be utilized in accordance with the one or more embodiments described herein. In addition, although FIG. 3 depicts a background mesh 305 that includes 16 elements, e.g., elements 315A-P, it is expressly contemplated that larger and more complex background meshes may be utilized in accordance with the one or more embodiments described herein.

With reference to FIG. 3 and according to the one or more embodiments described herein, the signed distance field module 118 may determine a number of subdivisions for each of elements 315A-P. For example, the number of subdivisions (S) for an element of a background mesh may be calculated as:

$$S = 4^d \sqrt{\frac{J}{J_0 J_p}},$$

where d is the space dimension, i.e., 2 for a 2-dimensional space and 3 for a 3-dimensional space, J is a Jacobian of the element, $J_o$ is a maximum of the Jacobian of the elements from which the material points within the element originate from, and $J_p$ is a maximum of the Jacobian of a deformation of the material points located in the element. In an embodiment, if the calculation of S does not produce an integer value, i.e., a decimal value is produced instead, then the signed distance field module 118 may round S down to a closest integer value. In an embodiment and if an element does not contain any material points, S may be a default value of 1.

In an implementation, S for an element may indicate a number of subdivisions for each edge of an element. For example, if the S value for an element is 3, then the signed distance module 118 may divide each edge of an element into three equally sized portions utilizing field nodes.

Figure 4:
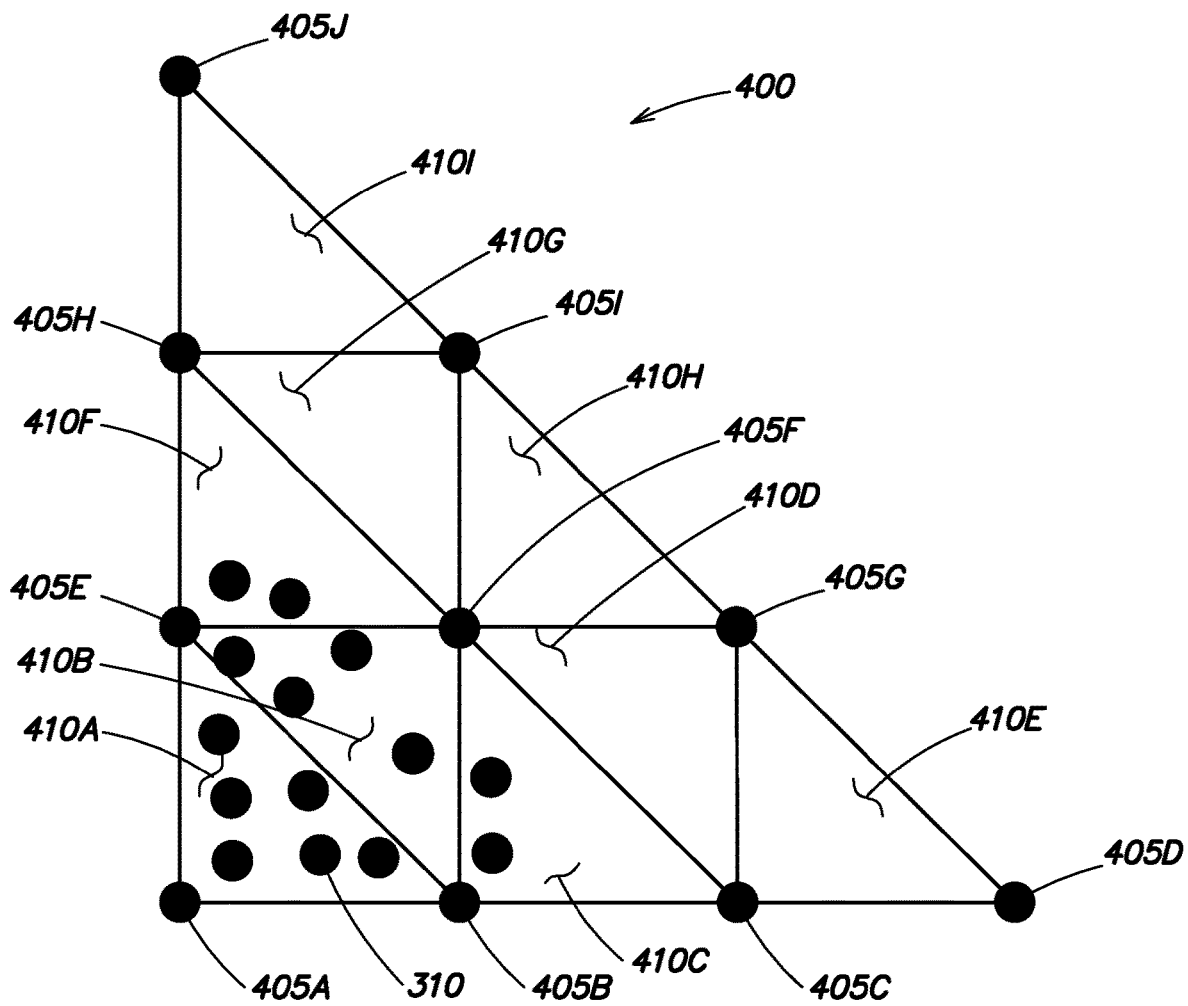
FIG. 4 is a diagram illustrating an example element that is divided into sub-elements based on a subdivision number and utilizing field nodes according to the one or more embodiments described herein.

FIG. 4 is a diagram illustrating an example element 400 that is divided into sub-elements 410A-I based on a subdivision number (S) and utilizing field nodes 405A-J according to the one or more embodiments described herein. According to the one or more embodiments described herein, the signed distance field module 118 may virtually divide element 400 into sub-elements 410A-I based on S. In the example of FIG. 4, let it be assumed that S calculated for element 400 is 3. As such, the signed distance field module 118 may virtually divide each edge of element 400 into 3 equally sized portions based on the placement of the field nodes on the edges as depicted in FIG. 4. For example, field nodes 405B and 405C are placed at the locations in FIG. 4 such that the horizontal edge of element 400 is divided into three equally sized portions. Similarly, field nodes 405H and 405E are placed at the locations in FIG. 4 such that the vertical edge of element 400 is divided into three equally sized portions. Additionally, field nodes 405I and 405G are placed at the locations in FIG. 4 such that the diagonal edge of element 400 is divided into three equally sized portions.

The signed distance field module 118 may then divide an element into a number of sub-elements ($S_{sub}$) as:

$$S_{sub} = S^d,$$

where d is the space dimension, i.e., 2 for a 2-dimensional space and 3 for a 3-dimensional space. In this example, let it be assumed that d is 2. Accordingly, the element 400 is divided into 9 (e.g., $3^2$) sub-elements 410A-I, which are triangles, utilizing field nodes 405A-J that are at the locations as depicted in FIG. 4.

The position of each of the field nodes may be determined based on the value of S calculated for the element. Continuing with the example of FIG. 4 where the value of S is 3, the signed distance module may determine the distance between the field nodes along an x-axis, e.g., $delta_x$, and the distance between field nodes along the y-axis, e.g., $delta_y$, based on S. The signed distance field module 118 may then determine the position of one or more interior field nodes (e.g., field node 405F that is not located on an edge of element 400) utilizing $delta_x$ and/or $delta_y$.

In the example of FIG. 4, three field nodes are connected together to define a perimeter of each of sub-elements 410A-I. For example, field nodes 405A, 405B, and 405E are connected together to define the perimeter of sub-element 410A. Similarly, field nodes 405H, 405I, and 405F are connected together to define the perimeter of sub-element 410G, and so forth.

Additionally, it is expressly contemplated that nodes of an element where a plurality of edges of a background mesh meet, as depicted in FIG. 3, may also be referred to as field nodes as depicted in FIG. 4 that are utilized to generate a signed distance field according to the one or more embodiments described herein. For example, field nodes 405A, 405D, and 405J that define the perimeter of element 400 of FIG. 4 may also be corresponding nodes of elements where a plurality of edges meet. Thus, it is expressly contemplated that nodes of an element may also be field nodes of an element according to the one or more embodiments described herein.

Figure 5:
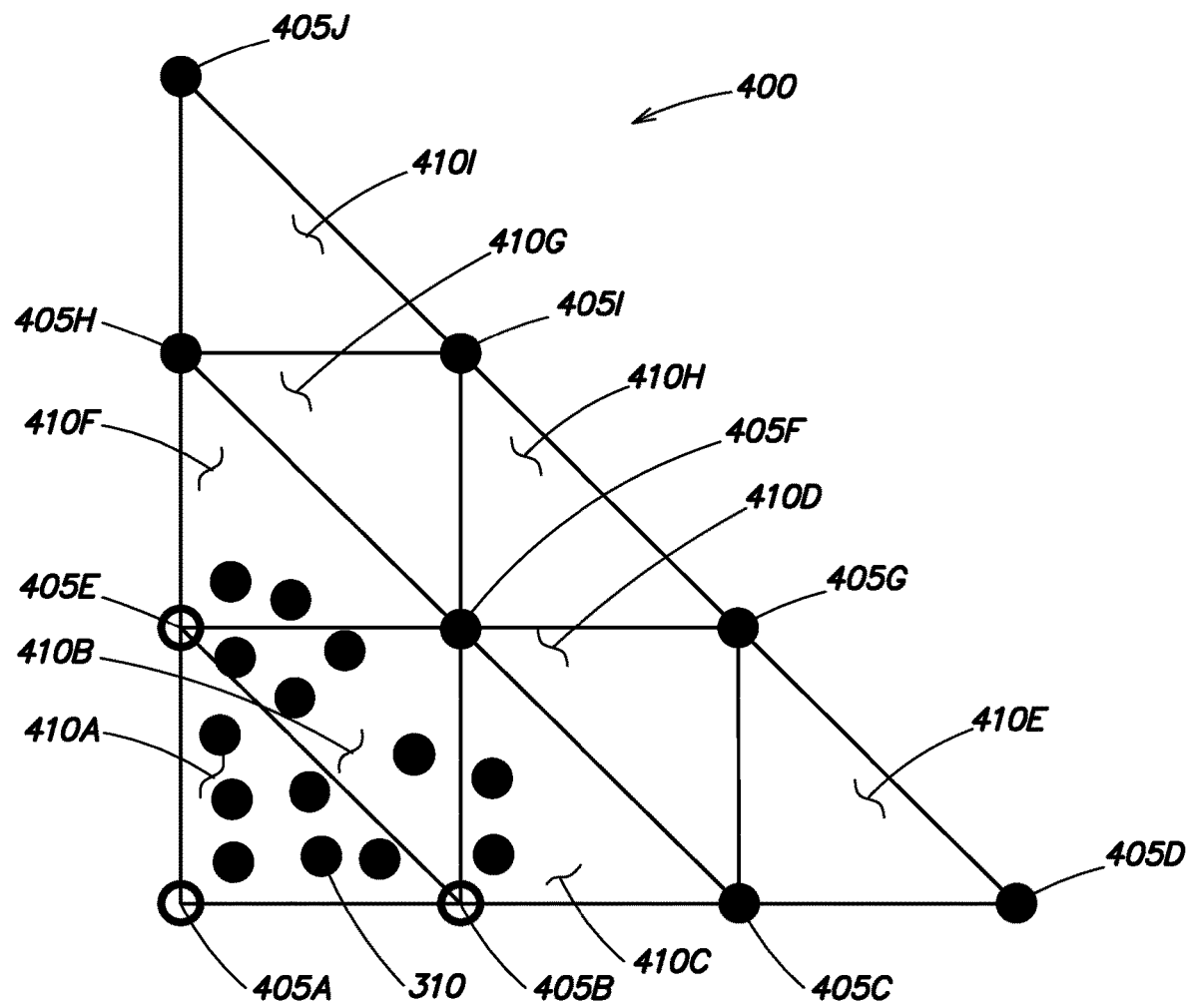
FIG. 5 is a diagram illustrating an example for determining whether each field node of the element of FIG. 4 is either inside or outside the material point cloud according to the one or more embodiments described herein.

After each element of the background mesh is divided into sub-elements based on S calculated for each element, the procedure continues to step 215 and the signed distance field module 118 determines if each field node, for each element of the background mesh, is inside or outside of the material point cloud. FIG. 5 is a diagram illustrating an example for determining whether each field node of the element 400 of FIG. 4 is either inside or outside the material point cloud according to the one or more embodiments described herein.

Specifically, the signed distance field module 118 may determine that if a sub-element is empty, e.g., does not include any material points, the field nodes that are connected to the empty sub-element are outside the point cloud. The signed distance field module 118 may determine that the field nodes that are not determined to be outside the material point cloud are inside the material point cloud.

For example, and with reference to FIG. 5, the signed distance field module 118 may determine that sub-element 410D is empty. Accordingly, the signed distance field module 118 may determine that field nodes 405C, 405F, 405G are outside the material point cloud since field nodes 405C, 405F, and 405G are connected to empty sub-element 410D. Similarly, the signed distance field module 118 may determine that field nodes 405D, 405H, 405I, and 405J are outside the material point cloud since field nodes 405D, 405H, 405I, and 405J are connected to empty sub-elements 410E, 410G, 410H, and 410I. According to the one or more embodiments described herein, a field node that is outside of the material point cloud may be referred to as an outside field node. Outside field nodes 405C-D and 405F-J are indicated as being outside the material point cloud utilizing dark, i.e., filled in, circles in FIG. 5.

Because field nodes 405A-B and 405E are not determined to be outside the material point cloud, the signed distance field module 118 may determine that field nodes 405A-B and 405E are inside the material point cloud. According to the one or more embodiments described herein, a field node that is inside of the material point cloud may be referred to as an inside field node. Inside field nodes 405A-B and 405E are indicated as being inside the material point cloud utilizing empty circles in FIG. 5.

As depicted in FIG. 5, the value of S that is used to divide element 400 into sub-elements ensures that inside field nodes 405A, 405B, and 405E are spaced far enough apart such that there is at least one material point located in between any given pair of inside field nodes 405A, 405B, and 405E that are determined to be inside the material point cloud. Because at least one material point is located between any given pair of inside field nodes 405A, 405B, and 405E, a discretization error will not occur because of the spacing and a discretization error may be indicative of a physical hole in the material point cloud. In addition, the value of S that is used to divide element 400 into sub-elements may ensure that a number of the field nodes 410A-J (e.g., 10 field nodes) is sufficient such that the nearby local features, e.g., kinks, bumps, cusps, etc., of the material point cloud are accounted for when the signed distance field is generated as described in further detail below with reference to FIGS. 6-10.

Referring back to FIG. 3, each of elements 315A-P may be divided into sub-elements based on S and each field node may be determined to be inside or outside of the material point cloud in a similar manner as described above with reference to FIGS. 2, 4 and 5. For example, and because elements 315K-P are empty elements, S for elements 315K-P may be a default value of 1. As such, elements 315K-P are not divided into sub-elements and instead only include an empty area between the three nodes that define the perimeters of each of elements 315K-P. Therefore, each of the nodes that define the perimeters of elements 315K-P are outside field nodes as described above with reference to FIGS. 2 and 5.

Further, because elements 315A-J include material points, S for each of elements 315A-J may be one or more different integer values that are greater than 1. Thus, each of elements 315A-J may be divided into sub-elements based on S as described above with reference to FIGS. 2 and 4. In the example of FIG. 3, let it be assumed that because elements 315C, 315D, 315G, and 315H are completely filled with material points, none of the sub-elements of elements 315C, 315D, 315G, and 315H are empty. Accordingly, all the field nodes of elements 315C, 315D, 315G, and 315H are inside field nodes as described above with reference to FIGS. 2 and 5. Additionally, in the example of FIG. 3, let it be assumed that because elements 315A, 315B, 315E, 315F, 315I, and 315J are not completely filled with material points, one or more sub-elements of elements 315A, 315B, 315E, 315F, 315I, and 315J are empty sub-elements. Accordingly, elements 315A, 315B, 315E, 315F, 315I, and 315J include both inside field nodes and outside field nodes as described above with reference to FIGS. 2 and 5.

Therefore, and according to the one or more embodiments described herein, the field nodes of elements 315A-J and the volumes of the material points can be utilized to generate the signed distance field to the surface of the material point cloud according to the one or more embodiments described herein and as described in further detail below with reference to FIGS. 6-10.

Figure 6:
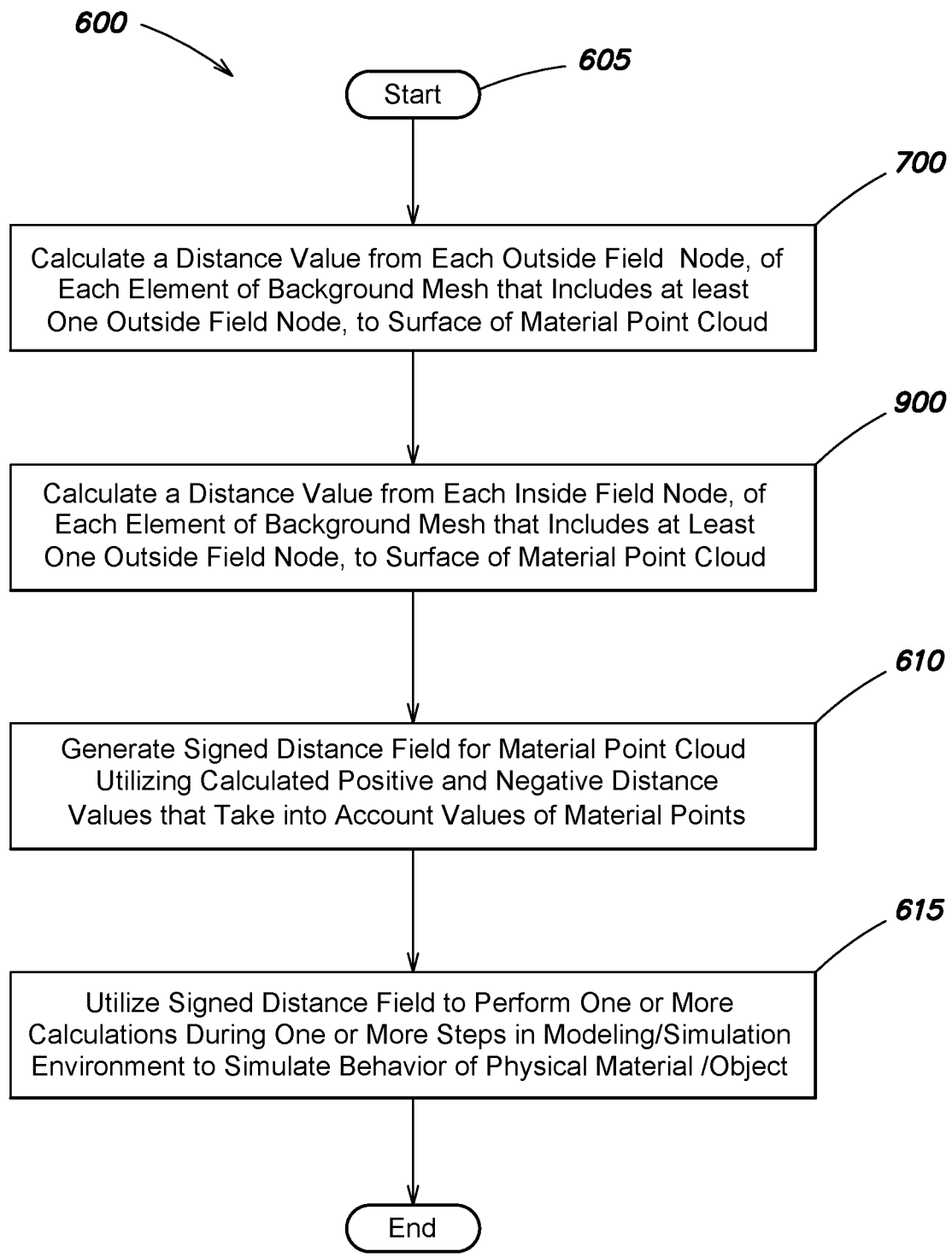
FIG. 6 is a flow diagram of a sequence of steps for generating a signed distance field based on vectors calculated from field nodes to the surface of the material point cloud and volumes of the material points according to the one or more embodiments described herein.

After each of the field nodes is determined to be either inside or outside of the material point cloud, the procedure 600 continues to step 700 of FIG. 6. FIG. 6 is a flow diagram of a sequence of steps for generating a signed distance field based on vectors calculated from field nodes to the surface of the material point cloud and volumes of the material points according to the one or more embodiments described herein.

Figure 7:
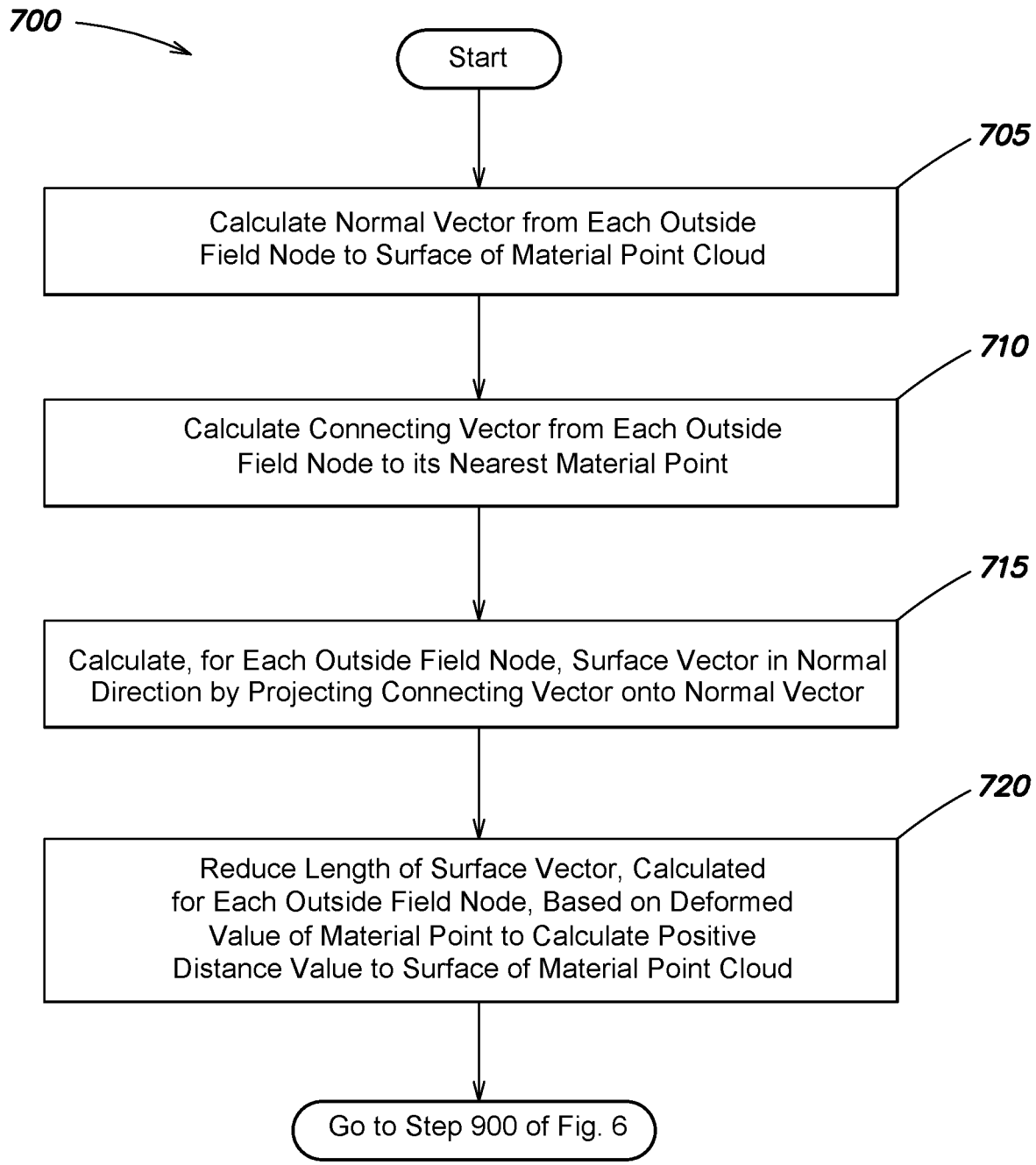
FIG. 7 is a flow diagram of a sequence of steps for calculating a distance value (e.g., a positive distance value) from each outside field node, of each element of the background mesh that includes at least one outside field node, to a surface of the material point cloud according to one or more embodiments described herein.

Procedure 600 starts at step 605 and continues to step 700 where the signed distance field module 118 calculates a distance value from each outside field node, of each element of the background mesh that includes at least one outside field node, to a surface of the material point cloud. FIG. 7 is a flow diagram of a sequence of steps for calculating a distance value (e.g., a positive distance value) from each outside field node, of each element of the background mesh that includes at least one outside field node, to a surface of the material point cloud according to one or more embodiments described herein. Although the examples described with reference to FIG. 7 may at times refer to a single outside field node (e.g., a given outside field node) of a single element, it is expressly contemplated that procedure 700 of FIG. 7 may be applied in parallel or serially to each outside field node of each element of a background mesh that includes at least one outside field node according to the one or more embodiment described herein.

Additionally, and for simplicity and ease of understanding, the examples described with reference to FIG. 7 may refer to sub-elements and material points that are included/contained in a single element (e.g., element 400) to calculate a distance from a given outside field node (e.g., 405J) to the surface of the material point cloud. However, it is expressly contemplated that the one or more embodiments described herein may calculate the distance from the given outside field node to the surface of the material point cloud, as described in further detail below, based on selected material points (e.g., 310 of FIG. 3) included/contained in one or more identified nearest non-empty sub-elements of all elements (e.g., 315A-P of FIG. 3) of a background mesh (e.g., 305 of FIG. 3). As such, the examples as described herein with reference to FIG. 7 should be taken as exemplary only.

At step 705 of procedure 700, the signed distance field module 118 calculates a normal vector from each outside field node to a surface of a material point cloud. Specifically, and as will be described in further detail below, the signed distance field module 118 may identify, for a given outside field node, one or more nearest non-empty sub-elements. The identified non-empty sub-elements can be used to select one or more material points that are used to calculate the normal vector from the given outside field node to the surface of the material point cloud as described in further detail below.

More specifically, and to identify the one or more nearest non-empty sub-elements to a given outside field node, the signed distance field module 118 may first calculate a distance from the given outside field node to each field node of each non-empty sub-element. As an example, and referring to FIG. 5, let it be assumed that field node 405J is the given outside field node. For the example of FIG. 5, sub-elements 410A-C and 410F each include at least one material point. As such, sub-elements 410A-C and 410F are non-empty sub-elements. Therefore, the signed distance field module 118 may calculate a distance from field node 405J to each of field nodes 405A-C, 405E-F, and 405H that define the perimeters of non-empty sub-elements 410A-C and 410F.

The signed distance field module 118 may then select a shortest distance from the calculated distances and identify the field node that corresponds to the shortest distance. In this example, the shortest calculated distance is from field node 405J to field node 405H. Specifically, the distance from field node 405J to field node 405H is less than the distances from field node 405J to field nodes 405A, 405B, 405C, 405E, and 405F. As such, the signed distance field module 118 identifies field node 405H as a nearest field node of any non-empty sub-element, e.g., 410A-C and 410F.

The signed distance field module 118 may then identify the non-empty sub-elements, that are connected to the identified nearest field node, as the nearest non-empty sub-elements to the given outside field node. In this example, sub-element 410F is the only non-empty sub-element that is connected to nearest field node 405H. As such, the signed distance field module 118 identifies non-empty sub-element 410F as the nearest non-empty sub-element to outside field node 405J. However, if in another example field node 405F was determined to be the nearest field node of non-empty sub-elements 401A-C and 410F, the signed distance field module 118 would have identified non-empty sub elements 410B, 410C, and 410F that are connected to node 405F as the nearest non-empty sub-elements.

Now that the nearest non-empty sub-elements to the given outside field node have been identified, the signed distance field module 118 may identify a field node, of the nearest non-empty sub-elements, to select one or more material points that are used to calculate the normal vector. Specifically, the signed distance field module 118 may identify a field node, of all of the field nodes that define the perimeter (s) of the nearest non-empty sub-elements, that is farthest away from the given outside field node. Continuing with the example of FIG. 5, the signed distance field module 118 may compare each of the distances from field node 405J to field nodes 405E-F, and 405H that define the perimeter of nearest non-empty sub-element 410F to determine which distance is the greatest. In this example, let it be assumed that the distance from field node 405J to field node 405F is greater than each of the distances from field node 405J to field nodes 405E and 405H. Therefore, and in this example, the signed distance field module 118 identifies field node 405F as the field node, of the nearest non-empty sub-elements (e.g., 410F), that is farthest away from the field node 405J.

The distance from the given outside field node, e.g., node 405J, to the farthest field node, e.g., 405F, of the nearest non-empty sub-elements, may be utilized by the signed distance field module 118 as a cut-off radius to select one or more material points. The selected one or more material points can then be used by the signed distance field module 118 to calculate the normal vector from the given outside field node to the surface of the material point cloud as described in further detail below.

Figure 8:
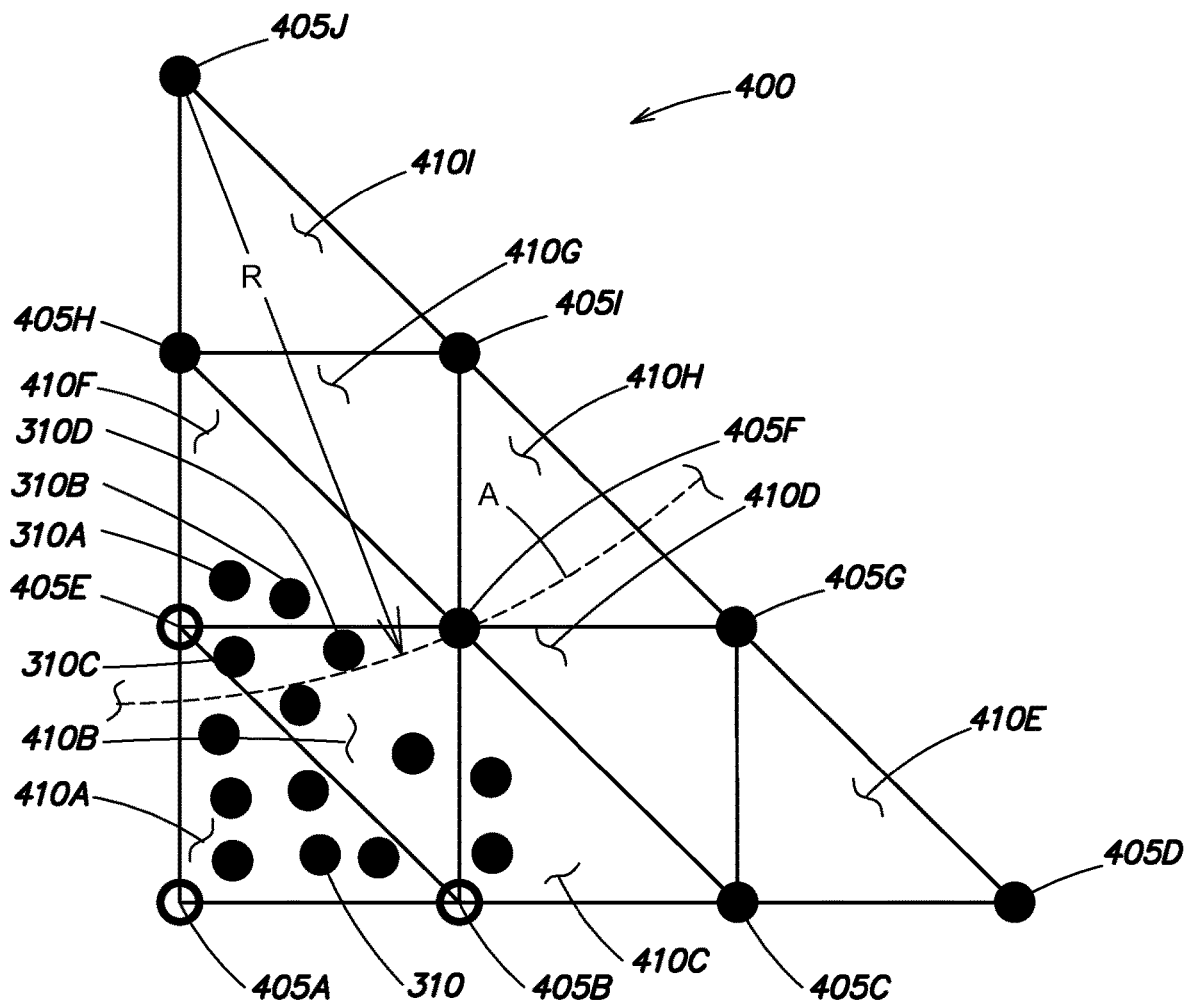
FIG. 8 is a diagram illustrating an example for utilizing a cutoff radius with element of FIGS. 4 and 5 to select one or more material points according to the one or more embodiments described herein.

FIG. 8 is a diagram illustrating an example for utilizing a cutoff radius with element 400 of FIGS. 4 and 5 to select one or more material points according to the one or more embodiments described herein. Let it be assumed that the cutoff radius R defines a circle, for field node 405J that in this example is the given outside field node, that is represented by an arc A in FIG. 8. The signed distance field module 118 may determine that any material points that are within circle are to be selected to compute the normal vector from field node 405J to the surface of the material point cloud according to the one or more embodiments described herein. Specifically, the signed distance field module 118 may compare the value of R with the distances from field node 405J to each of the material points 310 and determine that a material point is selected if the distance from field node 405J to the material point is less than R. Thus, and in this example, let it be assumed that the distance from field node 405J to material point 310A is less than R, the distance from field node 405J to material point 310B is less than R, the distance from field node 405J to material point 310C is less than R, and the distance from field node 405J to material point 310D is less than R. Additionally, let it be assumed that the distances from field node 405J to the other material points is equal to or greater than R. Therefore, and in this example, the signed distance field module 118 selects material points 310A, 310B, 310C, and 310D that are used to calculate the normal vector from field node 405J to the surface of the material point cloud.

With the MPM and as known by those skilled in the art, each material point in a point cloud may be assigned a point weight. In an implementation, the point weight for a material point may be calculated as the Jacobian of an undeformed element in which the material point was initially located divided by the number of material points that were originally located in the undeformed element in which the material point was originally located. In an implementation, the point weight ($W_p$) for a material point may be calculated as:

$$W_p = \frac{J_{UE}}{n_p},$$

where $J_{UE}$ is an undeformed element in which the material point was initially located and $n_p$ is the number of material points that were originally located in the undeformed element in which the material point was originally located.

The signed distance field module 118 may utilize the $W_p$ of the selected material points with the vectors from the given outside field node to the selected material points. Specifically, the signed distance field module 118 may weight the vectors by the their corresponding $W_p$ and then accumulate the weighted vectors to generate an accumulated vector. For example, the signed distance field module 118 may generate the accumulated vector ($A_v$) for the selected material points are located at a distance that is less than R as:

$$A_v = \Sigma_{P:dist(N,P)<R} W_p \overline{PN},$$

where P: dist (N, P)<R select each vector from the given node (N) to the material points (P) that is less than R, and $\overline{PN}$ is the vector from N to P. Therefore, and referring to the example of FIG. 8, the signed distance field module 118 may multiple $W_p$ for material point 310A with the vector from field node 405J to material point 310A, and may also multiple $W_p$ for material point 310B with the vector from field node 405J to material point 310B. Additionally, the signed distance field module 118 may multiply $W_p$ for material point 310C with the vector from field node 405J to material point 310C, and may also multiply $W_p$ for material point 310D with the vector from field node 405J to material point 310D. The results of the four multiplications may be summed, e.g., accumulated, to generate $A_v$ for node 405J.

The signed distance field module 118 may then normalize $A_v$ to calculate the normal vector from the given outside field node to the surface of the material point cloud. For example, the signed distance field module 118 may normalize $A_v$ to calculate the normal vector ($n_N$) as:

$$n_N = \frac{A_v}{|A_v|}.$$

Thus, and in this example, the signed distance field module 118 may calculate $n_N$ for field node 405J, which is an outside field node of element 400. Additionally, and with reference to FIG. 8, the signed distance field module 118 may calculate $n_N$ for each of the other outside field nodes, e.g., 405C, 405D, and 405F-J, in a similar manner as described above.

Accordingly, the signed distance field module 118 may calculate $n_N$ for each outside field node for each element that includes at least one outside field node. For example, and referring to the example of FIG. 3, the signed distance field module 118 may calculate $n_N$ for each outside field node for each of elements 315A, 315B, 315E, 315F, 315I, and 315J-P, each of which includes at least one outside field node.

In an embodiment, and when an element with at least one material point is a border element, $n_N$ calculated for an outside field node for the border element may be tilted. A border element may be an element that does not include a neighboring element on at least one side. For example, and as depicted in FIG. 3, elements 315B, 315C, 315H, and 315I are border elements that include at least one material point. In an implementation, the signed distance field module 118 may determine that an element is a border element based on a determination that an element, that includes at least one material point, includes at least one edge, i.e., boundary, that is not shared by a neighboring element. For example, a vertical edge of element 315B, which includes at least one material point, is not shared by a neighboring element and may thus be determined to be a border element. Similarly, the vertical edge of element 315I, which includes at least one material point, is not shared by a neighboring element and may thus be determined to be a border element.

The signed distance field module 118 may determine that when an outside field node is within a threshold distance of an edge of a border element that is not shared by a neighboring element, the $n_N$ calculated for the outside field node is tilted. In an embodiment, and to correct a tilted $n_N$ calculated for the outside field node of a border element, the signed distance field module 118 may mirror, at the boundary of the mesh 305 (e.g., vertical edge of element 315B), the material points that are: (1) within the elements of the background mesh and within the distance R to the outside field node, and (2) within a boundary threshold distance to the edge that is not shared by the neighboring element. The signed distance field module 118 may then utilize the mirrored material points with the material points in the border element to calculate $n_N$ in the manner described above. Utilizing the mirrored material points (not shown) with the material points in the border element results in the calculation $n_N$ that is corrected for the tilting.

After the normal vector is calculated for the given outside field node, the signed distance field module 118 may calculate a magnitude, e.g., length, resulting in a surface vector, in the normal direction from the given outside field node to the surface of the material point cloud, having a length that represents the distance from the given outside field node to the surface of the material point cloud. Specifically, and as described in further detail below, the length of the surface vector in the normal direction from the given outside field node to the surface of the material point cloud may be calculated utilizing a vector from the given outside field node to a nearest material point and a volume, e.g., deformed volume, of the nearest material point. Referring back to FIG. 7, and to calculate the length, the procedure continues to step 710 and the signed distance field module 118 calculates a connecting vector from each outside field node to its nearest material point.

For example, and with reference to FIG. 8, the nearest material point to the given outside field node 405J is material point 310A. As such, the signed distance field module 118 may calculate a connecting vector connecting node 405J to material point 310A. Additionally, and with reference to FIG. 8, the signed distance field module 118 may calculate the connecting vector for each of the other outside field nodes. In this example with reference to element 400, the signed distance field module 118 may also calculate the connecting vector from each of outside field nodes 405C, 405D, and 405F-I to its nearest material point. Additionally, and referring to the example of FIG. 3, the signed distance field module 118 may calculate a connecting vector connecting each outside field node to a nearest material point for each of elements 315A, 315B, 315E, 315F, 315I, and 315J-P, each of which includes at least one outside field node.

Referring back to FIG. 7, the procedure continues to step 715 and the signed distance field module 118 calculates a surface vector, for each outside field node, by projecting the connecting vector onto the normal vector. For example and with reference to FIG. 8, the signed distance field module 118 may project the connecting vector, connecting node 405J to its nearest material point 310A, onto the normal vector, $n_N$, calculated for node 405J as described above with reference to step 705 of FIG. 7. Projecting the connecting vector onto the normal vector produces a surface vector in the normal direction with a length that is an actual shortest distance between the outside given field node, e.g., 405J, to the surface of the material point cloud. The signed distance field module 118 may project the connecting vector onto the normal vector for each of the other outside field nodes to produce surface vectors in the normal directions to the surface of the material point cloud for each of the other outside field nodes in a similar manner as described above. In this example with reference to element 400, the signed distance field module 118 may project the connecting vectors, connecting each of outside field nodes 405C, 405D, and 405F-I to its nearest material point, onto the normal vectors, $n_N$, respectively calculated for nodes 405C, 405D, and 405F-I to produce surface vectors for outside field nodes 405C, 405D, and 405F-I. Additionally, and referring to the example of FIG. 3, the signed distance field module 118 may calculate the surface vector in the normal direction to the surface of the material point cloud for each outside field node of elements 315A, 315B, 315E, 315F, 315I, and 315J-P, each of which includes at least one outside field node, in a similar manner as described above.

The procedure continues to step 720 and signed distance field module 118 reduces the length of the surface vector, calculated for each outside field node, based on a volume, e.g., deformed volume, of a material point to calculate a positive distance value to the surface of the material point cloud. Specifically, the length of the surface vector produced in step 715 may be an overestimate of a distance from the outside field node 405J to the surface of the material point cloud because it does not take into account the volume of the nearest material point that, for example, may deform and change during simulation time steps. Accordingly, the one or more embodiments described herein may take into account the deformed volumes of the material points at one or more simulation time steps to generate the signed distance field to the surface of the material point cloud.

Specifically, the signed distance field module 118 may intersect the surface vector produced in step 715 with a deformed volume associated with material point 310A that is the closest material point to outside field node 405J to reduce the length of the surface vector based on the deformed volume of material point 310A.

For example, when a physical material/body is initially discretized by material points 310, the signed distance module 118 may assign each of the material points 310 a fraction of the physical material's/body's volume by dividing an entire volume of the physical material/body by a total number of the material points 310. Therefore, and based on the initial discretization, each material point 310 has an initial volume (e.g., an undeformed volume).

In an implementation, the undeformed volume for a particular material point, e.g., material point 310A, may be based on a position of an arbitrary point in the undeformed volume. Specifically, the undeformed volume for material point 310A may be calculated as X0+V0, where X0 is the initial position of material point 310A, and V0 is the position of the arbitrary point in the undeformed volume for material point 310A where a center of the undeformed point may be assumed to be at a 0 location (e.g., 0,0 for a 2-dimensional space and 0,0,0 for a 3-dimensional space).

After one or more simulation time steps, the application 125 may calculate a displacement field (U). The signed distance field module 118 may utilize the calculated displacement field, U, to calculate an updated position of material point 310A after the one or more time steps. Specifically, the signed distance field module 118 may calculate the updated position of material point 310A as X0+U(X0). As such, the updated position of material point 310A is "shifted" from its initial position by a value of U at the initial position. Additionally, an updated undeformed volume for material point 310A may be calculated based on the updated position of material point 310A and V0 (i.e., the position of the arbitrary point in the undeformed volume). Specifically, the signed distance field module 118 may calculate the updated undeformed volume for material point 310A as X0+U(X0)+V0.

With the updated undeformed volume calculated for material point 310A after one or more simulation time steps, the signed distance field module 118 may calculate the deformed volume for material point 310A after the one or more time steps utilizing the Jacobian (J) obtained for material point 310A, where J may be calculated in any of a variety of different ways and as known by those skilled in the art (e.g., a transformation may be calculated for material point 310A in element 400 based on a reference point in a reference element, and the Jacobian for material point 310A may be calculated as a derivative of the transformation with respect to the spatial coordinates, e.g., x, y in a 2-dimensional space and x, y, z, in a 3-dimensional space). In an embodiment, the signed distance field module 118 may calculate the deformed volume for material point 310A after the one or more simulation time steps as X0+U(X0)+J*V0.

Continuing with the example where node 405J is the given outside field node, the signed distance module 118 may intersect the surface vector for node 405J with the deformed volume of material point 310A calculated as described above, and the intersected part of the surface vector for node 405J may be removed. In an embodiment and to intersect the surface vector with the deformed volume, the signed distance field module 118 may compute a distance between the material point 310A and a boundary of the calculated deformed volume into a direction of the surface vector calculated for node 405J. The signed distance field module 118 may then reduce the length of the surface vector calculated for node 405J by the computed distance. The length of the surface vector, after removal of the intersected part based on the deformed volume of the material point 310A, may be a positive distance value from outside field node 405J to the surface of the material point cloud that takes into account the deformed volume of the material point 310A.

In this example with reference to element 400, the signed distance field module 118 may reduce the lengths of the surface vectors for outside field nodes 405C, 405D, and 405F-I based on a deformed volume of a nearest material point in a similar manner as described above to calculate a positive distance from outside field nodes 405C, 405D, and 405F-I to the surface of the material point cloud. Additionally, and referring to the example of FIG. 3, the signed distance field module 118 may reduce the lengths of the surface vectors for the outside field nodes of each of elements 315A, 315B, 315E, 315F, 315I, and 315J-P based on a deformed volume of a nearest material point in a similar manner as described above to calculate a positive distance from the outside field nodes to the surface of the material point cloud.

Therefore, the signed distance field module 118 may calculate a distance from each outside field node, of each element in a background mesh that includes at least one outside field node, to the surface of the material point cloud that takes into account the deformed and changing volumes of the material points over simulation time steps as described above with reference to the FIGS. 6-8.

For simplicity and ease of understanding, the example as described above for calculating the distance from given outside field node 405J to the surface of the material point cloud is based on the sub-elements and material points only contained in element 400. However, it is expressly contemplated that the distance from each given outside field node to the surface of the material point cloud may be calculated, in a similar manner as described above, based on all the sub-elements and material points contained in all elements of a background mesh. Thus, the example as described above with reference to outside field node 405J should be taken as exemplary only.

Figure 9:
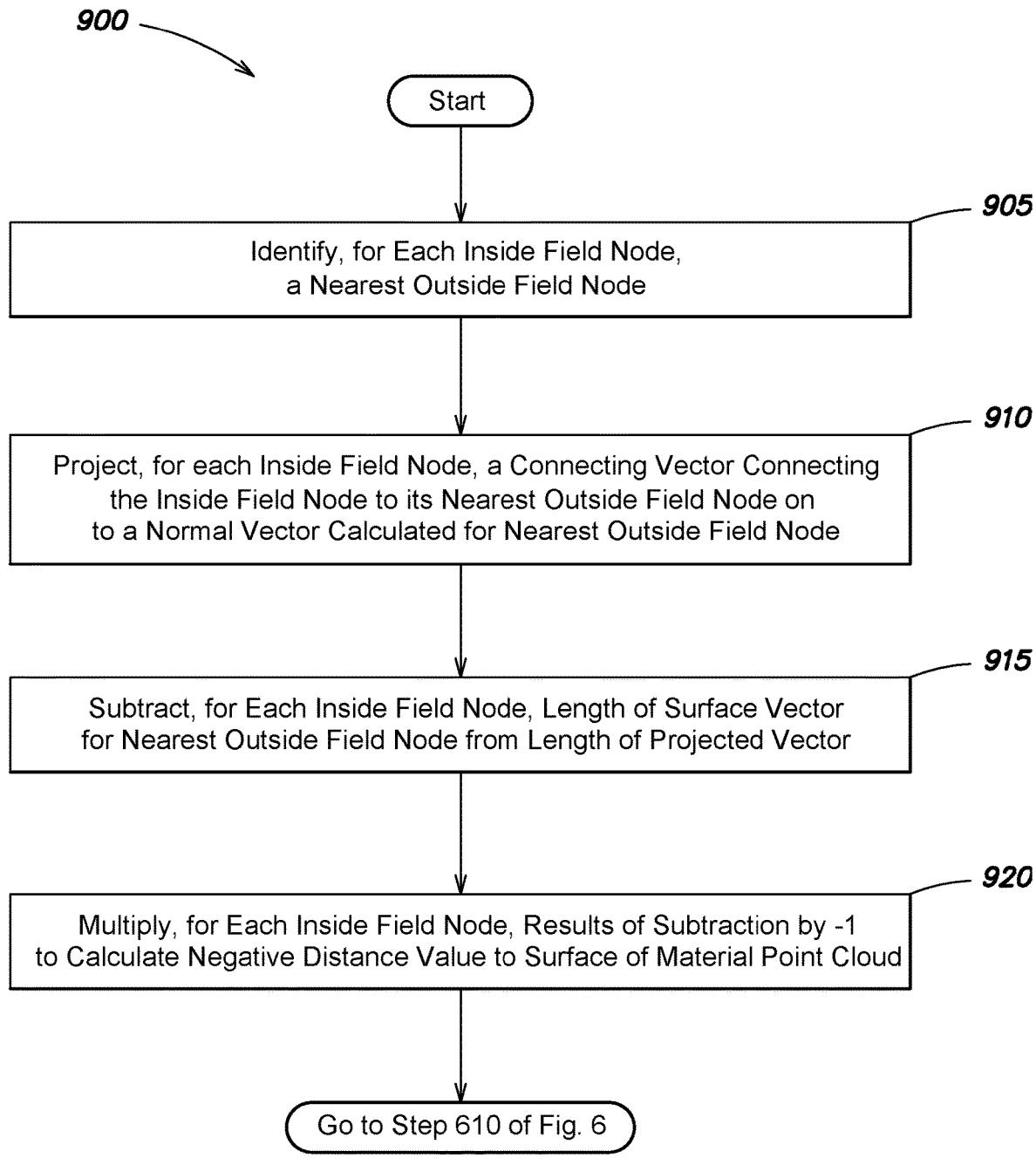
FIG. 9 is a flow diagram of a sequence of steps for calculating a distance value (e.g., a negative distance value) from each inside field node, of each element of a background mesh that includes at least one inside field node, to a surface of the material point cloud according to one or more embodiments described herein.

Referring back to procedure 600 of FIG. 6, and after the distance values from the outside field nodes to the surface of the material point cloud are calculated at step 700, the procedure continues to step 900 and the signed distance field module 118 calculates a distance from each inside field node, of each element of the background mesh that includes at least one inside field node, to a surface of the material point cloud. FIG. 9 is a flow diagram of a sequence of steps for calculating a distance value (e.g., a negative distance value) from each inside field node, of each element of a background mesh that includes at least one inside field node, to a surface of the material point cloud according to one or more embodiments described herein. Although the example described with reference to FIG. 9 may at times refer to a single inside field node of a single element, it is expressly contemplated that procedure 900 of FIG. 9 may be applied in parallel or serially to each inside field node of each element of a background mesh according to the one or more embodiments described herein.

Additionally, and for simplicity and ease of understanding, the examples described with reference to FIG. 9 may refer to sub-elements and material points that are included/contained in a single element (e.g., element 400) to calculate a distance from a given inside field node (e.g., 405A) to the surface of the material point cloud. However, it is expressly contemplated that the one or more embodiments described herein may calculate the distance from the given inside field node to the surface of the material point cloud, as described in further detail below, based on all the sub-elements and material points (e.g., 310 of FIG. 3) included/contained in all the elements (e.g., 315A-P of FIG. 3) of the background mesh (e.g., 305 of FIG. 3). As such, the examples as described with reference to FIG. 9 should be taken as exemplary only.

At step 905 of procedure 900, the signed distance field module 118 identifies, for each inside field node, a nearest outside field node. As an example and with reference to FIG. 5, let it be assumed that inside field node 405A is a given inside field node. The signed distance field module 118 may calculate a distance from inside field node 405A to each outside field node, e.g., 405C, 405D, and 405F-J. The signed distance field module 118 may compare the distances and determine that the distance from inside field node 405A to outside field node 405F is shorter than the distances from inside field node 405A to the other outside field nodes, e.g., 405C, 405D, and 405G-J. As such, the signed distance field module 118 may determine that outside field node 405F is the nearest outside field node to inside field node 405A. The signed distance field module 118 may also identify a nearest outside field node for inside field nodes 405B and 405E in a similar manner. Additionally, and referring to the example of FIG. 3, the signed distance field module 118 may identify a nearest outside field node for each inside field node of each of elements 315A-J, each of which includes at least one inside field node.

The procedure continues to step 910 and the signed distance field module 118 projects, for each inside field node, a connecting vector connecting the inside field node to its nearest outside field node onto the normal vector calculated for the nearest outside field node. Continuing with the example where inside field node 405A is the given inside field node, the signed distance field module 118 may project the connecting vector, connecting inside field node 405A to outside field node 405F that is the nearest outside field node, onto the normal vector that may be calculated for outside field node 405F as described above with reference to step 705 of procedure 700. The signed distance field module 118 may, in an implementation, determine a length of the projected vector.

The procedure continues to step 915 and the signed distance field module 118 subtracts, for each inside field node, a length of the surface vector for the nearest outside field node from the length of the projected vector. Continuing with the example where inside field node 405A is the given inside field node, the surface vector for nearest outside field node 405F, that may be calculated as described with reference to at step 715 of FIG. 7, represents a distance from the outside field node 405F to the surface of the material point and takes into account a volume, e.g. deformed volume, of a nearest material point. Therefore, subtracting a length of the surface vector from the length of the connecting vector projected onto the normal vector, which is done in step 910, produces a distance value from the inside field node 405A to the surface of the material point cloud that takes into account the volume of the material point. The result of the subtraction may be a positive distance value.

Therefore, the procedure may continue to step 920 and the signed distance field module 118 may multiply, for each inside field node, the result of the subtraction by −1 to calculate a negative distance value from the inside field node 405A to the surface of the material point cloud.

The signed distance field module 118 may calculate a distance value (e.g., negative distance value) from inside field nodes 405B and 405E to the surface of the material point cloud in a similar manner. Additionally, and referring to the example FIG. 3, the signed distance field module 118 may calculate a distance value (e.g., negative distance value) from each inside field node of each of elements 315A-J to the surface of the material point cloud.

For simplicity and ease of understanding, the example as described above for calculating the distance from given inside field node 405A to the surface of the material point cloud is based on the sub-elements and material points only contained in element 400. However, it is expressly contemplated that the distance from each given inside field node to the surface of the material point cloud may be calculated, in a similar manner as described above, based on all the sub-elements and material points contained in all elements of a background mesh. Thus, the example as described above with reference to outside field node 405A should be taken as exemplary only.

Referring back to FIG. 6, and after the distance values from the inside and outside field nodes to the surface of the material point cloud are calculated, the procedure continues to step 610 and the signed distance field module 118 generates a signed distance field for the material point cloud utilizing the calculated positive and negative distance values that take into account volumes of the material points. Specifically, each of the individually calculated distance values from the inside field nodes and the outside field node provide a distance to a nearest location where the signed distance field is equal to zero. Therefore, the calculated distance values may provide a location of the surface of the material point cloud that may change during simulation time steps, where points in space that are outside the material point cloud have positive signed distance values and the points in space that are inside the point cloud have negative signed distance values.

For example, the signed distance field can be generated for one or more first time steps that takes into account the volumes of the material points during the one or more first time steps, and the signed distance field can be generated for one or more different time steps that takes into account the volumes of the material points during one or more different time steps. Accordingly, the signed distance field, generated according to the one or more embodiments described herein, can change over simulation time steps based on the volumes of the material points that may change over the simulation time steps.

Figure 10:
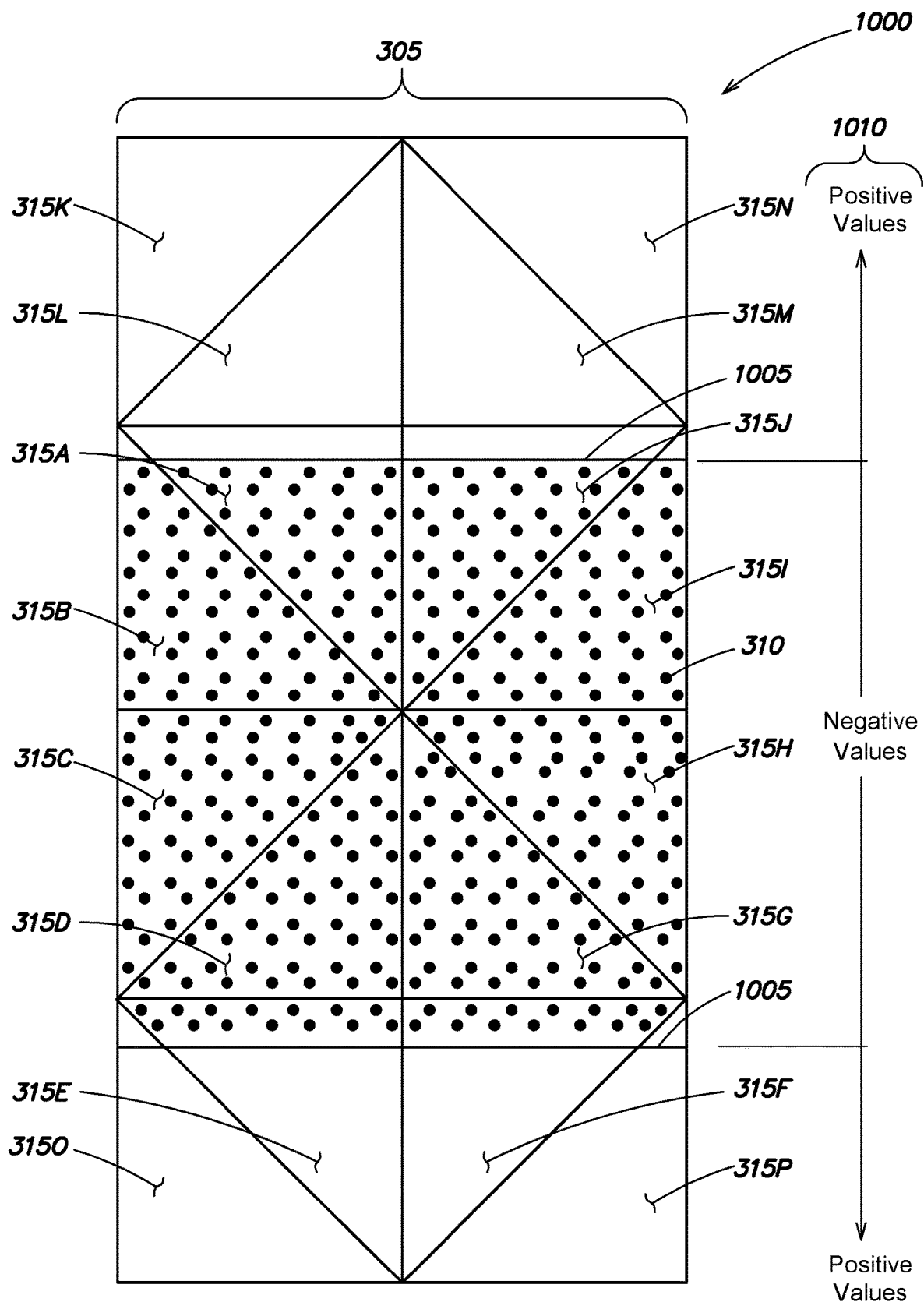
FIG. 10 is a diagram illustrating example output data in a modeling/simulation environment that is based on the input data of FIG. 3, where the output data includes a surface of a material point cloud that is calculated based on the signed distance field generated according to the one or more embodiments described herein.

FIG. 10 is a diagram illustrating example output data 1000 in a modeling/simulation environment that is based on the input data 300 of FIG. 3, where the output data 1000 includes a surface 1005 of a material point cloud that is calculated based on the signed distance field 1010 generated according to the one or more embodiments described herein. With reference to FIG. 3, elements 315A-P include inside and/or outside field nodes. Accordingly, the signed distance field module 118 may generate signed distance field 1010 to calculate a location of surface 1005 based on the calculated distances for the inside and outsides field nodes as described above with reference to FIGS. 2-9. The generated signed distance field 1010 may have positive values for points in space that are outside the material point cloud, may have decreasing positive values as points in space approach the surface 1005, may have a value of zero at the surface 1005, and may have negative values inside the material point cloud. Although FIG. 10 depicts the surface 1005 being at a particular location, it is expressly contemplated that the location of the surface 1005 may change over one or more time steps as, for example, the volumes of the materials points deform, i.e., change, during simulation time steps.

The procedure may, optionally, continue to step 615 and the signed distance field 1010 may be utilized to perform one or more calculations during one or more time steps in a modeling/simulation environment to simulate a behavior of a physical material/object. For example, the solver 119 may utilize the signed distance field 1010, generated according to the one or more embodiments described herein, to, for example, assemble a stiffness matrix and a right-hand side vector to simulate a behavior of the physical material/object that may exhibit deformations and/or to simulate a behavior of an interaction of a plurality of materials/objects that may exhibit deformations. The procedure then ends at step 620.

Because the signed distance field is generated based on the calculated vectors and volumes of material points that may change over time steps of the simulation, the one or more embodiments described herein generate a more accurate signed distance field than other systems and techniques that do not, for example, take into account the volumes of the material points.

As such, the signed distance field generated according to the one or more embodiments described herein can be used to perform the calculations during time steps of a simulation, which in turn improves the accuracy of the results of the calculations and/or stability to perform the calculations during simulation. Because the accuracy of results and stability during simulation are improved, the size of the time steps may be increased during simulation, which in turn results in a reduced number of calculations having to be performed during the simulation (i.e., less number of calculations have to be performed when compared to techniques that use a signed distance field that does not take into account volumes of material points). Because less calculations have to be performed, the one or more embodiments described herein conserve processing resources of a computer, e.g., device, that executes the simulation and performs the calculations. As such, the one or more embodiments described herein provide an improvement to a computer, e.g., a device that executes the simulation and performs the calculations, itself.

It should be understood that various adaptations and modifications may be readily made to what is described above, to suit various implementations and environments. For example, although the flow diagrams of FIGS. 2, 6, 7, and 9 are shown to be separate for clarity and ease of understanding, it is expressly contemplated that a single flow diagram including the steps of FIGS. 2, 6, 7, and 9 may be implemented according to the one or more embodiments described herein. Additionally, while it is discussed above that many aspects of the techniques may be implemented by specific software processes (e.g., of an application stored in a non-transitory electronic device readable medium for execution on one or more processors) or on specific hardware devices, it should be understood that some or all of the techniques may also be implemented by different software on different hardware. In addition to general-purpose computing devices/electronic devices, the hardware may include specially configured logic circuits and/or other types of hardware components. Above all, it should be understood that the above descriptions are meant to be taken only by way of example.

What is claimed is:

1. A system for generating a signed distance field to a surface of a material point cloud for a material point method that is used for geotechnical engineering for simulation of a behavior of a physical material or an object that exhibits deformations, the system comprising:
   an application executing on a computing device, the application configured to:
   divide at least one element of a mesh into a plurality of sub-elements utilizing a plurality of field nodes, wherein the physical material or the object is discretized by a plurality of material points of the material point cloud and the plurality of material points are contained within the mesh,
   wherein the plurality of field nodes include: (1) at least one inside field node that is inside the material point cloud, and (2) at least one outside field node that is outside the material point cloud;
   calculate a first distance from the at least one outside field node to the surface of the material point cloud based on a first length of a first surface vector in a first normal direction from the at least one outside field node to the surface of the material point cloud, wherein the first length is based on at least a first volume of a first material point of the of the plurality of material points;
   calculate a second distance from the at least one inside field node to the surface of the material point cloud based on a second length of a second surface vector, wherein the second surface vector is in a second normal direction from a selected outside field node to the surface of the material point cloud, and wherein the second length is based on at least a second volume of a second material point of the material point cloud;
   generate, for the material point method that is used for geotechnical engineering, the signed distance field to the surface of the material point cloud utilizing the calculated first distance and calculated second distance; and
   utilize the signed distance field during one or more time steps to simulate, in a simulation environment, the behavior of the physical material or the object that exhibits the deformations.

2. The system of claim 1, wherein the at least one element is divided into the plurality of sub-elements based on a number of subdivisions that is calculated as:

$$S = 4^d \sqrt{\frac{J}{J_0 J_p}},$$

where S is the number of subdivisions, d is a space dimension, J is a Jacobian of the at least one element, $J_o$ is a first maximum of the Jacobian of a set of elements from which a set of material points, within the at least one element, originate from, and $J_p$ is a second maximum of the Jacobian of a deformation of the set of material points located in the at least one element.

3. The system of claim 1, wherein the application, when calculating the first distance, is further configured to:
   calculate a normal vector from the at least one outside field node to the surface of the material point cloud;
   project a connecting vector, connecting the at least one outside field node to a closest material points of the plurality of material points, onto the normal vector to calculate the first surface vector, wherein the closest material point is the first material point; and
   reduce a length of the first surface vector by a deformed volume of the closest material point.

4. The system of claim 1, wherein the application, when calculating the second distance, is further configured to:
project a connecting vector, connecting the at least one inside field node to a selected outside field node that is a closest outside field node, onto a normal vector from the closest outside field node to the surface of the material point cloud to calculate a projected vector;
subtract a length of the second surface vector from a length of the projected vector to calculate a positive second distance, wherein the length of the second surface vector is reduced by a deformed volume of the second material point; and
multiply the positive second distance by −1 to calculate the second distance.

5. The system of claim 1, wherein the at least one outside field node is connected to only empty sub-elements, of the plurality of sub-elements, that do not contain any of the plurality of material points.

6. The system of claim 1, wherein the at least one inside field node is connected to at least one non-empty sub-element, of the plurality of sub-elements, that contains at least one material point of the plurality of material points.

7. A method for generating a signed distance field to a surface of a material point cloud for a material point method that is used for geotechnical engineering for simulation of a behavior of a physical material or an object that exhibits deformations, the method comprising
dividing, an application executing on a computing device, at least one element of a mesh into a plurality of sub-elements utilizing a plurality of field nodes, wherein the physical material or the object is discretized by a plurality of material points of the material point cloud and the plurality of material points are contained within the mesh,
wherein the plurality of field nodes include: (1) at least one inside field node that is inside the material point cloud, and (2) at least one outside field node that is outside the material point cloud;
calculating, by the application, a first distance from the at least one outside field node to the surface of the material point cloud based on a first length of a first surface vector in a first normal direction from the at least one outside field node to the surface of the material point cloud, wherein the first length is based on at least a first volume of a first material point of the plurality of material point;
calculating, by the application, a second distance from the at least one inside field node to the surface of the material point cloud based on a second length of a second surface vector, wherein the second surface vector is in a second normal direction from a selected outside field node to the surface of the material point cloud, and wherein the second length is based on at least a second volume of a second material point of the material point cloud;
generating, by the application and for the material point method that is used for geotechnical engineering, the signed distance field to the surface of the material point cloud utilizing the calculated first distance and calculated second distance; and
utilize the signed distance field during one or more time steps to simulate, in a simulation environment, the behavior of the physical material or the object that exhibits the deformations.

8. The method of claim 7, wherein the at least one element is divided into the plurality of sub-elements based on a number of subdivisions that is calculated as:

$$S = 4^d \sqrt{\frac{J}{J_0 J_p}},$$

where S is the number of subdivisions, d is a space dimension, J is a Jacobian of the at least one element, $J_o$ is a first maximum of the Jacobian of a set of elements from which a set of material points, within the at least one element, originate from, and $J_p$ is a second maximum of the Jacobian of a deformation of the set of material points located in the at least one element.

9. The method of claim 7, further comprising:
calculating, by the application, a normal vector from the at least one outside field node to the surface of the material point cloud;
projecting, by the application, a connecting vector, connecting the at least one outside field node to a closest material points of the plurality of material points, onto the normal vector to calculate the first surface vector, wherein the closest material point is the first material point; and
reducing, by the application, a length of the first surface vector by a deformed volume of the closest material point to calculate the first distance.

10. The method of claim 7, further comprising:
projecting, by the application, a connecting vector, connecting the at least one inside field node to a selected outside field node that is a closest outside field node, onto a normal vector from the closest outside field node to the surface of the material point cloud to calculate a projected vector;
subtracting, by the application, a length of the second surface vector from a length of the projected vector to calculate a positive second distance, wherein the length of the second surface vector is reduced based on a deformed volume of the second material point; and
multiplying, by the application, the positive second distance by −1 to calculate the second distance.

11. The method of claim 7, wherein the at least one outside field node is connected to only empty sub-elements, of the plurality of sub-elements, that do not contain any of the plurality of material points.

12. The method of claim 7, wherein the at least one inside field node is connected to at least one non-empty sub-element, of the plurality of sub-elements, that contains at least one material point of the plurality of material points.

13. One or more non-transitory computer-readable media, having stored thereon instructions that when executed by a computing device, cause the computing device to perform operations for simulation of a behavior of a physical material or an object that exhibits deformations, the operations comprising:
dividing at least one element of a mesh into a plurality of sub-elements utilizing a plurality of field nodes, wherein the physical material or the object is discretized by a plurality of material points of a material point cloud and the plurality of material points are contained within the mesh,
wherein the plurality of field nodes include: (1) at least one inside field node that is inside an area or volume occupied by the material point cloud, and (2) at least one outside field node is outside the area or volume occupied by the material point cloud;
calculating a first distance from the at least one outside field node to a surface of the material point cloud based on a first length of a first surface vector in a first normal direction from the at least one outside field node to the surface of the material point cloud, wherein the first length is based on at least a first volume of a first material point of the of the plurality of material point;

calculating a second distance from the at least one inside field node to the surface of the material point cloud based on a second length of a second surface vector, wherein the second surface vector is in a second normal direction from a selected outside field node to the surface of the material point cloud, and wherein the second length is based on at least a second volume of a second material point of the material point cloud;

generating, for a material point method that is used for geotechnical engineering, a signed distance field to the surface of the material point cloud utilizing the calculated first distance and calculated second distance; and utilize the signed distance field during one or more time steps to simulate, in a simulation environment, the behavior of the physical material or the object that exhibits the deformations.

14. The one or more non-transitory computer-readable media of claim 13, wherein the at least one element is divided into the plurality of sub-elements based on a number of subdivisions that is calculated as:

$$S = 4^d \sqrt{\frac{J}{J_0 J_p}},$$

where S is the number of subdivisions, d is a space dimension, J is a Jacobian of the at least one element, $J_o$ is a first maximum of the Jacobian of a set of elements from which a set of material points, within the at least one element, originate from, and $J_p$ is a second maximum of the Jacobian of a deformation of the set of material points located in the at least one element.

15. The one or more non-transitory computer-readable media of claim 13, wherein performing the operation comprises:

calculating a normal vector from the at least one outside field node to the surface of the material point cloud;

projecting a connecting vector, connecting the at least one outside field node to a closest material points of the plurality of the material points, onto the normal vector to calculate the first surface vector, wherein the closest material point is the first material point; and reducing a length of the first surface vector by a deformed volume of the closest material point to calculate the first distance.

16. The one or more non-transitory computer-readable media of claim 13, wherein performing the operation comprises:

projecting a connecting vector, connecting the at least one inside field node to a selected outside field node that is a closest outside field node, onto a normal vector from the closest outside field node to the surface of the material point cloud to calculate a projected vector;

subtracting, by the application, a length of the second surface vector from a length of the projected vector to calculate a positive second distance, wherein the length of the second surface vector is reduced based on a deformed volume of the second material point; and multiplying, by the application, the positive second distance by −1 to calculate the second distance.

17. The one or more non-transitory computer-readable media of claim 13, wherein the at least one outside field node is connected to only empty sub-elements, of the plurality of sub-elements, that do not contain any of the plurality of material points.

* * * * *